United States Patent
Chin et al.

(10) Patent No.: US 7,161,186 B2
(45) Date of Patent: Jan. 9, 2007

(54) SIDEWAY-EMISSION LIGHT EMITTING DIODE

(75) Inventors: Yuan-Cheng Chin, Hsintien (TW); Hung-Chih Li, Taichung (TW)

(73) Assignees: Unity Opto Technology Co., Ltd., Taipei Hsien (TW); Genius Electronic Optical Co., Ltd., Taichung Hsien (TW)

( * ) Notice: Subject to any disclaimer, the term of this patent is extended or adjusted under 35 U.S.C. 154(b) by 0 days.

(21) Appl. No.: 10/920,335

(22) Filed: Aug. 18, 2004

(65) Prior Publication Data

US 2006/0038196 A1 Feb. 23, 2006

(51) Int. Cl.
*H01L 33/00* (2006.01)
*H01L 27/15* (2006.01)

(52) U.S. Cl. .................. 257/98; 257/88; 257/E33.055; 257/E33.056; 257/E33.057; 257/E33.058; 257/E33.059

(58) Field of Classification Search .................. 257/98, 257/88, E33.055–E33.059; 362/326, 800, 362/806
See application file for complete search history.

(56) References Cited

U.S. PATENT DOCUMENTS

| 6,441,750 | B1 * | 8/2002 | Hutchison | 340/907 |
| 6,450,661 | B1 * | 9/2002 | Okumura | 362/240 |
| 6,607,286 | B1 * | 8/2003 | West et al. | 362/255 |
| 6,896,381 | B1 * | 5/2005 | Benitez et al. | 359/858 |
| 2004/0037090 | A1 * | 2/2004 | Jacobs et al. | 362/556 |
| 2004/0223315 | A1 * | 11/2004 | Suehiro et al. | 362/84 |

* cited by examiner

*Primary Examiner*—Shouxiang Hu
(74) *Attorney, Agent, or Firm*—Troxell Law Office, PLLC

(57) ABSTRACT

A sideway-emission light emitting diode includes a light emitting diode package comprised of a light emitting diode dice that gives off light and a lens that is positioned in front of a front end face of the package for receiving the light and redirecting the received light toward a circumference of the package and a light guide comprised of a board defining a cavity to receive and retain the light emitting diode package therein. The board has opposite sides each forming a cut-off delimited by opposite inclined edges, a refraction section extending from each inclined edge, and a projection section formed between opposite refraction sections, whereby light transmitting into the light guide is directed, by means of the reflection/refraction by the inclined edges, the refraction sections and the projection sections, toward and projected from the projection sections in sideway directions.

7 Claims, 6 Drawing Sheets

SIDEWAY-EMISSION LIGHT EMITTING DIODE

FIELD OF THE INVENTION

The present invention generally relates to a sideway-emission light emitting diode (LED), and in particular to an LED lighting construction comprising an LED dice, a lens, and a light guide in combination to redirect light emitted from the LED dice with the aid of the lens into the light guide that guides and projects the light from projection sections on opposite sides whereby perfect sideway emission of light can be realized for better utilization in different environments, such as shopping malls, advertisement boards, and backlight devices.

BACKGROUND OF THE INVENTION

A conventional light emitting diode (LED), such as U.S. patent application Ser. No. 09/849,042 filed on May 4, 2001, which is particularly shown in FIGS. 1a and 1b of the attached drawings, comprises an LED package 1 having a front end face and an opposite rear end face. An LED dice 2 is embedded in the package 1 and gives off light in a first direction that is substantially normal to the front end face. A lens 3 is positioned in front of the front end face and receives the light emitted from the LED dice 2. The lens 3 receives almost all the components of the light from the LED dice 2, including the component of the light that travels substantially in the first direction, and redirects the light in directions that are substantially parallel to the front end face of the package 1. Although the light from the LED dice 2 can be effectively redirected by the lens 3 to travel in directions that are substantially parallel to the front end face, such light is randomly distributed along the whole circumference of 360 degrees of the lens. There is no way for such a conventional LED package to concentrate the light on a particular sideway direction.

SUMMARY OF THE INVENTION

Thus, a primary objective of the present invention is to provide a sideway-emission light emitting diode (LED), comprising an LED dice, a lens, and a light guide that are combined together to have all components of the light from the LED dice redirected by the lens into the light guide, which in turn guides and projects the light from projection sections on opposite sides to realize effective sideway emission/projection of light and thus enhancing practical applications of the light emitting diodes.

To achieve the above objective, in accordance with the present invention, a sideway-emission light emitting diode is provided, comprising a light emitting diode package comprising a light emitting diode dice that gives off light and a lens that is positioned in front of a front end face of the package for receiving the light and redirecting the received light toward a circumference of the package and a light guide comprising a board defining a cavity to receive and retain the light emitting diode package therein. The board has opposite sides each forming a cut-off delimited by opposite inclined edges, a refraction section extending from each inclined edge, and a projection section formed between opposite refraction sections, whereby light transmitting into the light guide is directed, by means of the reflection/refraction by the inclined edges, the refraction sections and the projection sections, toward and projected from the projection sections in sideway directions.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF THE PREFERRED EMBODIMENT

Figure 1A:
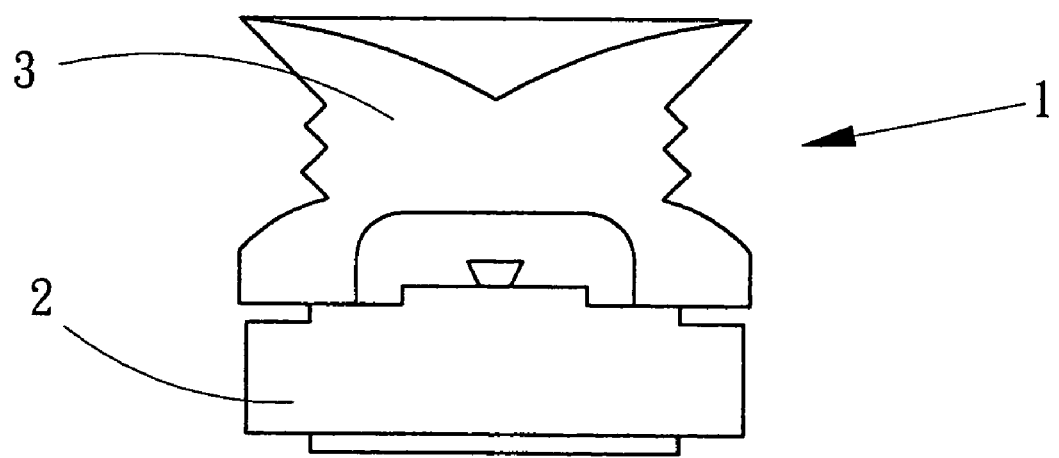
FIG. 1a is a schematic cross-sectional view of a conventional light emitting diode package.
Figure 1B:
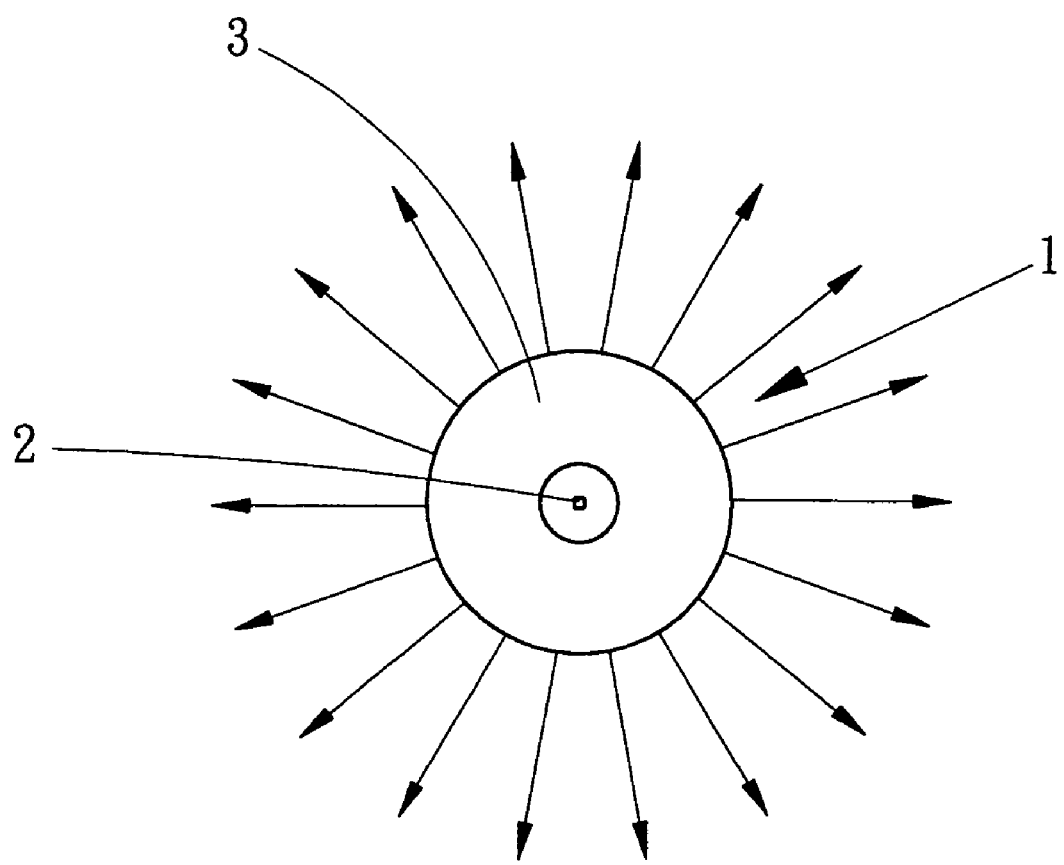
FIG. 1b is a schematic view showing the emission of light from the conventional light emitting diode package.
Figure 2:
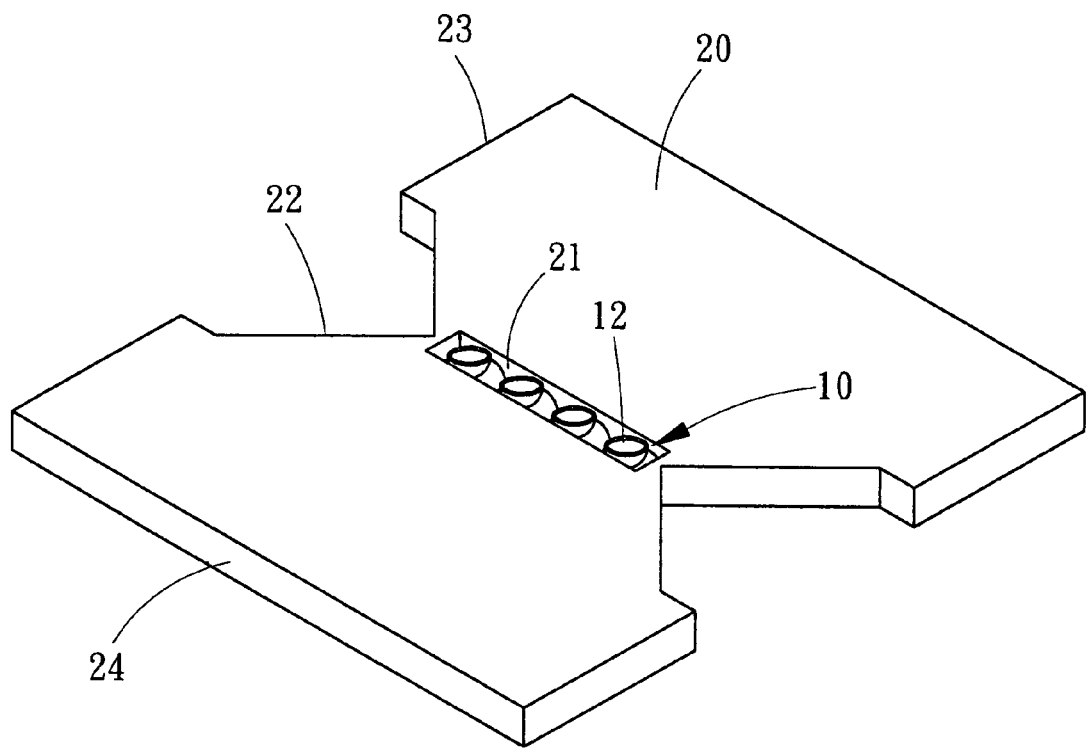
FIG. 2 is a perspective view of a sideway-emission light emitting diode assembly in accordance with the present invention.
Figure 3:
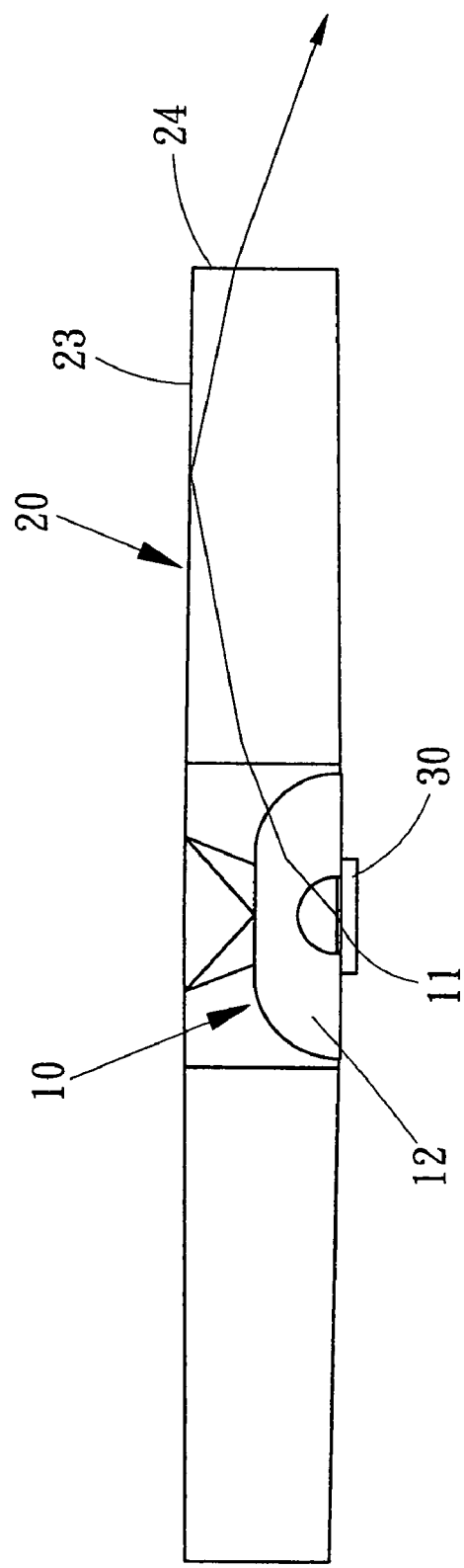
FIG. 3 is a cross-sectional view of the sideway-emission light emitting diode assembly of the present invention.
Figure 4:
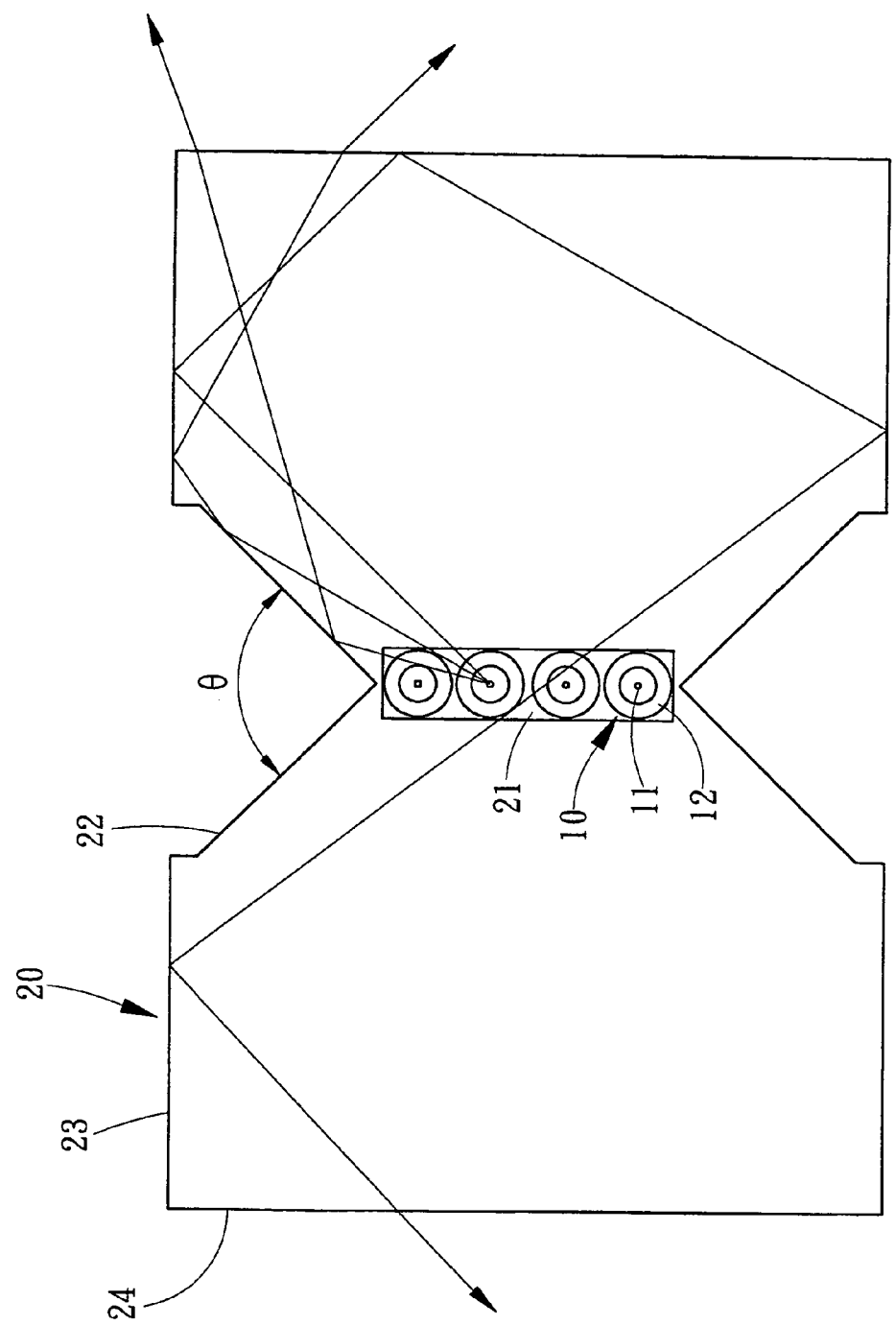
FIG. 4 is a plan view of the sideway-emission light emitting diode assembly of the present invention, illustrating paths of light emitted from light emitting diode dices incorporated in the assembly.

With reference to the drawings and in particular to FIGS. 2-4, a sideway-emission light emitting diode (LED) assembly constructed in accordance with the present invention comprises at least one LED package 10 comprised of an LED dice 11 and a lens 12. The lens 12 is positioned in front of a front end face of the LED package 10 to receive light emitted from the LED dice 11. The lens 12 is constructed to redirect substantially all the components of the light from the LED dice 11 toward a circumference of the LED package 10.

A light guide 20, preferably in the form of a board, defines a cavity 21 inside which the LED packages 10 are received and fixed. The light guide 20 has opposite sides in each of which an angled cut-off 22 is formed, which is delimited by two inclined edges having an included angle θ therebetween. The included angle is smaller than 95 degrees to properly guide the light from the LED dice 11. A refraction section 23 extends from each inclined edge of the angled cut-off 22 in opposite directions and a projection section 24 is formed between remote ends of the refraction sections 23 on the opposite lateral sides of the light guide 20 for projecting the light therefrom in sideway directions.

A circuit board 30 is mounted to a bottom of the light guide 20 and is in electrical connection with the LED dice 11.

By properly arranging and combining the LED dice 11, the lens 12, and the light guide 20 together, all the components of the light emitted from the LED dice 11 are redirected by the lens 12 to transmit through a lateral circumference of the LED package 10. All the light components that transmit through the lateral circumference of the LED package 10 travel into the light guide 12 and are guided by the light guide 12 by being reflected/refracted by the inclined edges of the cut-offs 22, the refraction sections 23, and the projection sections 24, to project from the projection sections 24 in the sideway directions. This enhances the practical applications of the LEDs.

Figure 5:
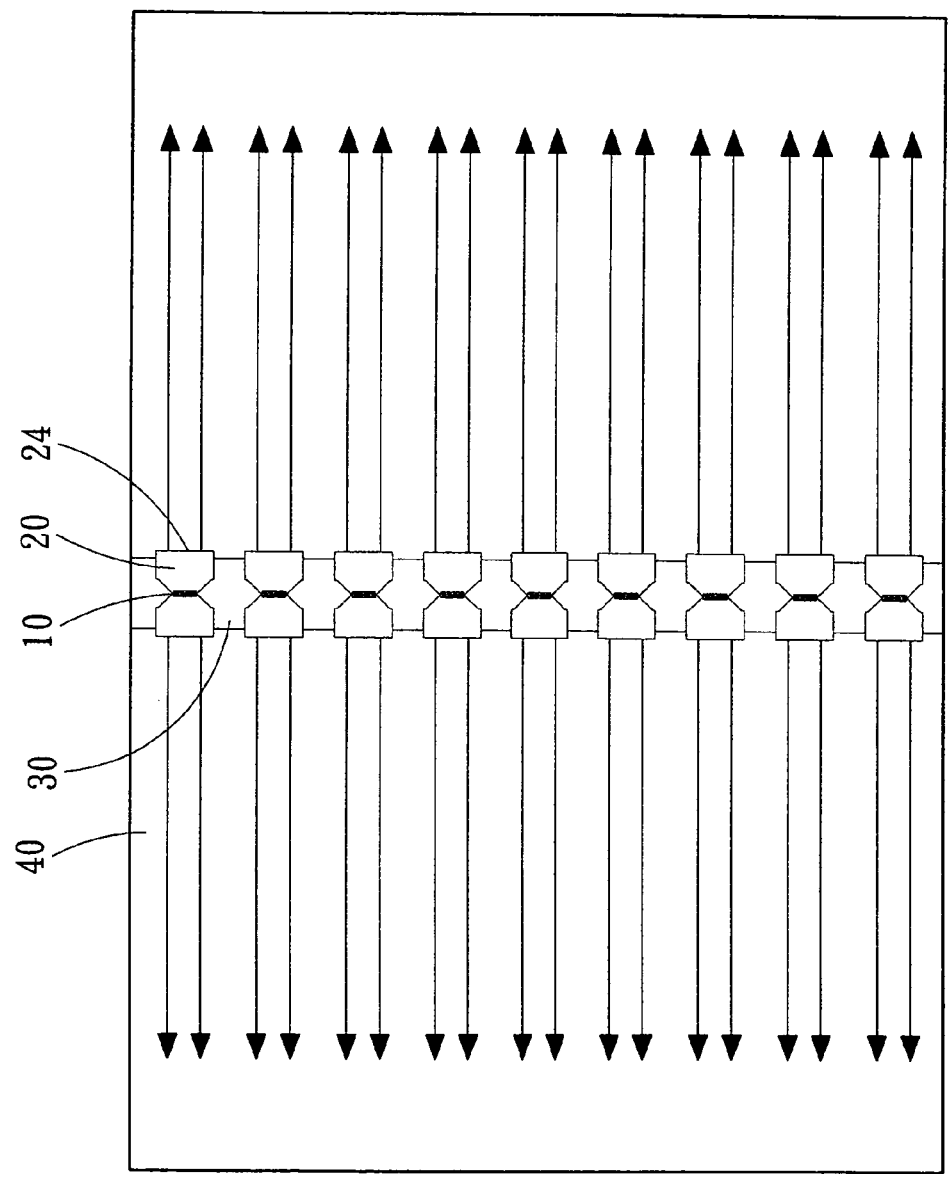
FIG. 5 is a plan view showing a practical application of the sideway-emission light emitting diode assembly of the present invention in a backlight device.

Also referring to FIG. 5, in a practical application of the LED in backlight devices, a number of LED packages 10 are mounted to the light guide 20 first. The circuit board 30 is then connected to the LED packages 10. The assembly is mounted to a backlight board 40 of the backlight device whereby light emitted from the LED packages 10 is redirected and guided to project from the projection sections 24 into the backlight board 40. Perfect sideway emission can be realized.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A sideway-emission light emitting diode comprising:
   at least one sideway-emission light emitting diode structure, each of the at least one sideway-emission light emitting diode structure having:
   a) at least one light emitting diode package, each package of the at least one light emitting diode package having:
      i) a light emitting diode die transmitting a light; and
      ii) a lens positioned over the light emitting diode die and receiving and redirecting the light toward a circumference of the package; and
   b) a light guide having:
      i) a cavity located in a center thereof, each of the at least one light emitting diode package is located in the cavity;
      ii) a first pair of opposing sides, each of the first pair of opposing sides is a refraction section and has two straight side portions and an angled cut-off located in a middle portion thereof between the two straight side portions, each angled cut-off has two inclined edges sloping outwardly with a predetermined angle there between; and
      iii) a second pair of opposing sides, each of the second pair of opposing sides has a projection section, ends of the first pair of opposing sides are located adjacent to ends of the second pair of opposing sides,
   wherein the refraction section reflecting the light toward the projection section, the light is released from the projection section.

2. The sideway-emission light emitting diode according to claim 1, wherein the predetermined angle is an angle less than 90 degrees.

3. The sideway-emission light emitting diode according to claim 1, further comprising a circuit board electrically connected to a bottom of each of the at least one light emitting diode package.

4. The sideway-emission light emitting diode according to claim 1, further comprising a circuit board electrically connected to each of the at least one light emitting diode package and located at a bottom of the light guide.

5. The sideway-emission light emitting diode according to claim 1, wherein the at least one light emitting diode package includes a plurality of light emitting diode packages positioned linearly in the cavity.

6. The sideway-emission light emitting diode according to claim 1, wherein the light guide has a flat top surface.

7. The sideway-emission light emitting diode according to claim 1, further comprising a backlight board, the at least one sideway-emission light emitting diode structure including a plurality of at least one sideway-emission light emitting diode structures located on the backlight board.

* * * * *